US012793750B2

(12) United States Patent
Fisher et al.

(10) Patent No.: US 12,793,750 B2

(45) Date of Patent: Nov. 10, 2026

(54) TEMPERATURE DIFFERENTIAL-BASED VOLTAGE OFFSET CONTROL

(71) Applicant: Micron Technology, Inc., Boise, ID (US)

(72) Inventors: Ryan G. Fisher, Boise, ID (US); Arvin Daniel A. Daguro, Boise, ID (US); Daniel R. Loughmiller, Boise, ID (US); Noel Marquez, Boise, ID (US); Reshmi Basu, Boise, ID (US); Kenneth Koenig, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 226 days.

(21) Appl. No.: 18/760,918

(22) Filed: Jul. 1, 2024

(65) Prior Publication Data

US 2024/0355367 A1 Oct. 24, 2024

Related U.S. Application Data

(63) Continuation of application No. 17/675,468, filed on Feb. 18, 2022, now Pat. No. 12,027,228.

(Continued)

(51) Int. Cl.

*G11C 7/04* (2006.01)
*G06F 3/06* (2006.01)
*G11C 16/26* (2006.01)

(52) U.S. Cl.

CPC ................ *G11C 7/04* (2013.01); *G06F 3/064* (2013.01); *G11C 16/26* (2013.01)

(58) Field of Classification Search

CPC ......... G11C 7/04; G11C 16/26; G11C 13/004; G11C 11/5628; G11C 13/0069; G11C 16/10; G11C 11/5642; G11C 16/3431

See application file for complete search history.

(56) References Cited

U.S. PATENT DOCUMENTS

2012/0134213 A1* 5/2012 Choi ...................... G11C 16/10 365/185.18

2014/0231954 A1 8/2014 Lue (Continued)

FOREIGN PATENT DOCUMENTS

WO 2017074570 A1 5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

*Primary Examiner* — Uyen Smet

(74) *Attorney, Agent, or Firm* — Brooks, Cameron & Huebsch, PLLC

(57) ABSTRACT

A method includes performing a first operation to program data to a group of memory cells of a memory device, wherein the data comprises host data and a bit pattern indicative of a first temperature of the group of memory cells and receiving a signal to perform a second operation to read the host data from the group of memory cells. The method further includes determining, responsive to receipt of the signal, whether a second temperature of the group of memory cells is outside a threshold temperature differential that is based on the bit pattern indicative of the first temperature of the group of memory cells, applying a voltage offset signal to the group of memory cells responsive to a determination that the second temperature of the group of memory cells is outside the threshold temperature differential, and performing the second operation to read the host data from the group of memory cells subsequent to application of the voltage offset signal to the group of memory cells.

16 Claims, 5 Drawing Sheets

Related U.S. Application Data

(60) Provisional application No. 63/291,702, filed on Dec. 20, 2021.

(56) References Cited

U.S. PATENT DOCUMENTS

| | | | | |
|---|---|---|---|---|
| 2016/0179386 | A1 | 6/2016 | Zhang | |
| 2016/0239235 | A1 * | 8/2016 | Chung | G11C 7/04 |
| 2019/0027223 | A1 * | 1/2019 | Yanagidaira | G11C 16/26 |
| 2019/0043567 | A1 * | 2/2019 | Khakifirooz | G11C 11/5642 |
| 2020/0411110 | A1 * | 12/2020 | Getreuer | G11C 16/0483 |

* cited by examiner

TEMPERATURE DIFFERENTIAL-BASED VOLTAGE OFFSET CONTROL

PRIORITY INFORMATION

This application is a continuation of U.S. application Ser. No. 17/675,468, filed Feb. 18, 2022, which issues as U.S. Pat. No. 12,027,228 on Jul. 2, 2024, which claims benefit of U.S. Provisional Application Ser. No. 63/291,702, filed on Dec. 20, 2021, the contents of which are incorporated herein by reference.

TECHNICAL FIELD

Embodiments of the disclosure relate generally to memory sub-systems, and more specifically, relate to temperature differential-based voltage offset control

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
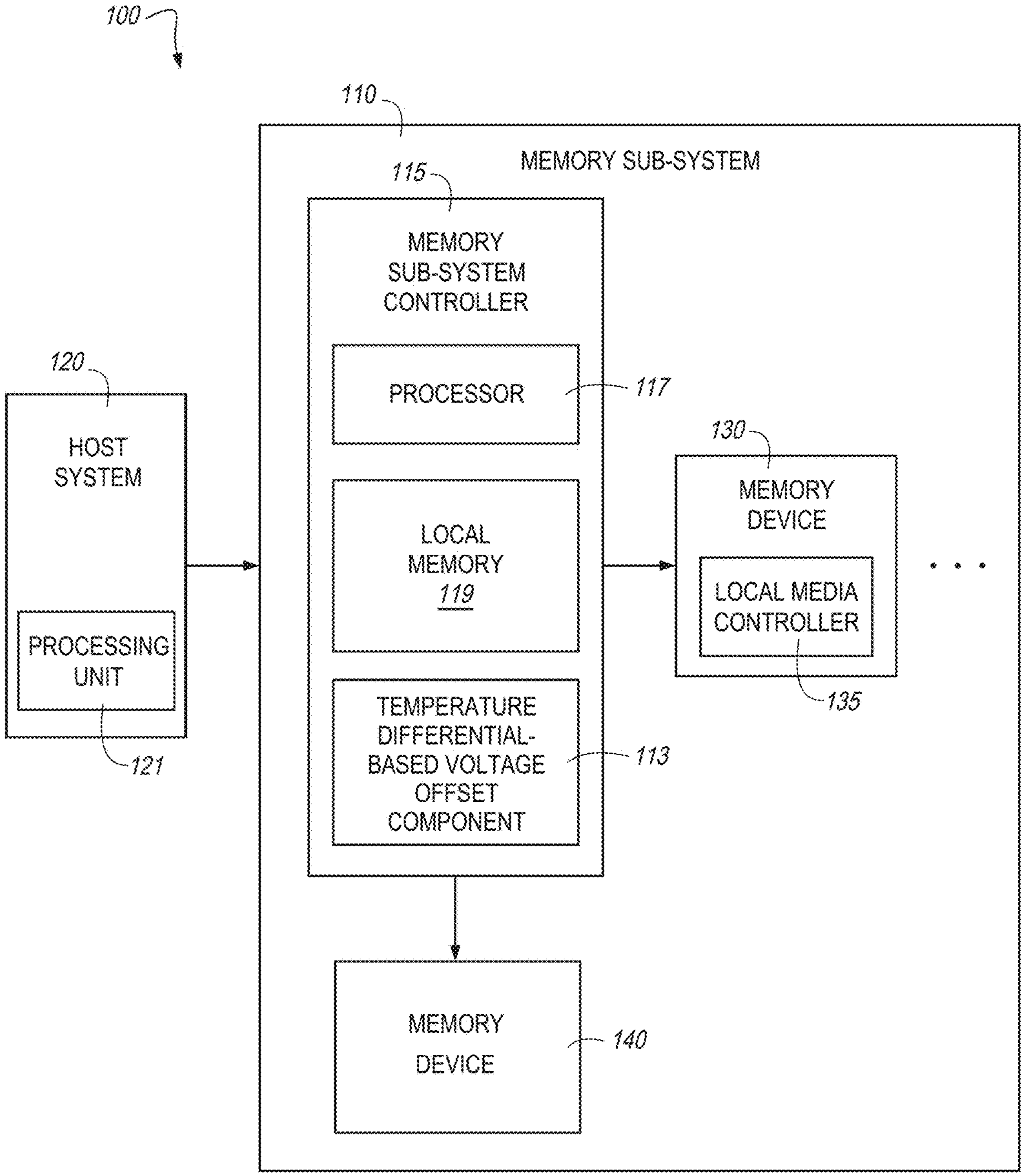
FIG. 1 illustrates an example computing system that includes a memory sub-system in accordance with some embodiments of the present disclosure.

Aspects of the present disclosure are directed to temperature differential-based voltage offset control in a memory sub-system, in particular to memory sub-systems that include a voltage offset component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states, while a TLC can store multiple bits of information and has eight logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates, while floating-gate architectures generally do not allow for the select gates to be programmed.

During operation, a memory sub-system can receive various memory access requests (e.g., requests to read or "retrieve" data and/or requests to write or "program" data to a memory device of the memory sub-system). Due to behaviors of the memory sub-system, the data can be written to the memory device when the memory device is operating at a first temperature and can be read from the memory device when the memory device is operating at a second temperature. This phenomenon (e.g., the sensing of data at a temperature different from that observed during programming) can be referred to as the "cross-temperature" phenomenon and can be a source of a large number of failed bits detected in performance of a read operation, which can lead to unrecoverable data corruption even using well-known error correction codes. Accordingly, a metric by which the performance of a memory device can be measured is the cross-temperature behavior of the memory device—that is, by how accurate the data read from the memory is when the data is read at a different temperature than a temperature at which the data was written to the memory device. As a result, the overall performance of the memory device can be based on the consistency at which data is correctly read from the memory device using a read voltage signal (e.g., a default read signal), particularly in the presence of cross-temperature effects.

As described herein, the greater the quantity of cross-temperature combinations that can be handled by a read voltage signal having a particular voltage associated therewith (e.g., a default read signal), the better the cross-temperature performance of the memory device. The quantity of cross-temperature combinations can refer to how many different write temperatures and read temperatures and/or the magnitude of the difference between the write temperature and the read temperature are supported by the memory sub-system and/or memory device. In general, as the cross-temperature performance of the memory device increases, a quality of service (QOS) of the memory device and/or a computing system in which the memory device is deployed increases as well.

Providing adequate cross-temperature performance can, however, be difficult, especially as memory device technology advances. For example, in memory devices that utilize TLCs, QLCs, and beyond, the read window budget of the memory device can be decreased in comparison to memory devices that utilize SLCs or MLCs. As used herein, the term "read window budget" (RWB) generally refers to a distance (e.g., in voltage) between adjacent threshold voltage (Vt) distributions at a particular bit error rate (BER) or raw bit error rate (RBER). A read window may also be referred to as a "valley margin" since the threshold voltage ($V_T$) distributions include respective peaks with the regions therebetween being referred to as valleys. The RWB can refer to a cumulative value of read windows for a group of programmed cells (e.g., one or more pages of cells). For example, TLCs can be configured to store three bits of data per cell may be programmed to one of eight different $V_T$ distributions, each corresponding to a respective data state. In this example, the RWB can be the cumulative value (e.g., in voltage) of the seven read windows between the eight $V_T$ distributions. The RWB corresponding to a group of memory cells is affected by various factors such as temperature, wear cycling (e.g., program/erase cycles), etc. Therefore, the RWB(s) of a system can vary over time, which can affect system QoS, reliability, and/or performance. In various instances, it can be beneficial to maintain a specified RWB in order to maintain a particular system characteristic (e.g., QoS, error rate, etc.) across various environmental conditions and/or user workloads.

As the quantity of the respective data states supported by a memory device further increases, the RWB can become further strained, which can lead to the cross-temperature performance of the memory device being increasingly negatively impacted. For example, because the RWB for QLCs and beyond becomes even further stratified as the quantity of available states per memory cell further increases, the cross-temperature performance can become further reduced in comparison to approaches that employ SLCs or MLCs as opposed to TLCs, QLCs, or beyond. Further, mechanisms and stresses such as read disturb, latent read disturb, data retention, endurance, and/or trigger rates, etc. that are experienced by the memory device may consume a greater portion of the RWB as memory device technology advances toward TLCs, QLCs, and beyond.

In order to address these and other issues associated with providing adequate cross-temperature performance in a memory device, some approaches rely on determining, generally by the memory device itself, a temperature of memory cells of the memory device that are involved in performance of a read operation. Such approaches can further include application of a compensation factor to a voltage signal (e.g., a read level) applied in performance of the read operation. However, by merely utilizing the temperature of the memory cells at the time of performance of the read operation, such internal memory device temperature compensation paradigms may not account for the temperature of the memory cells at the time of a preceding write operation, and therefore may fail to adequately address cross-temperature performance of the memory device.

Some other approaches may rely on maintaining a portion of the RWB for performance of cross-temperature memory operations. Such approaches may allow for cross-temperature performance to be improved in comparison approaches that do not utilize a designated portion of the RWB. However, as described above, due to the competing interests that may be demanding portions of the RWB, especially as the quantity of the respective data states supported by a memory device increases past SLCs and MLCs, it has become increasing difficult to dedicate a portion of the RWB solely for cross-temperature performance, especially while meeting the stringent QoS requirements of modern memory devices.

Yet other approaches may rely on advanced host level solutions in which the host embeds temperature information at or around the time of the write operation in metadata that is written to the memory device during performance of the write operation. Such approaches can, however, be costly to implement, incur excess system overhead, and/or can reduce overall system QoS metrics. Further, such approaches generally do not allow for corrective action to be taken prior to the host receiving (e.g., reading) the data. Accordingly, such approaches generally require that data that is read by the host and, if necessary, re-read subsequently if the data contains errors. This can increase data traffic on an interface coupling the host to the memory device and further lead to a reduction in overall system performance.

Aspects of the present disclosure address the above and other deficiencies by allowing for the memory device and/or for a host system coupled to the memory device to determine a temperature of memory cells of the memory device both at time when a write operation is performed and when a read operation involving data (e.g., host data) written to the memory device is performed. The difference between the temperature when the write operation is performed and when the read operation is performed can be compared to a threshold temperature differential (e.g., a determined delta in temperature for accurate retrieval of the data from the memory device) to determine if the difference between the temperature when the write operation is performed and when the read operation is performed falls outside the threshold temperature differential.

If it is determined that the difference between the temperature when the write operation is performed and when the read operation is performed falls outside the temperature differential, the memory device (e.g., a controller or other circuitry resident on the memory device) can adjust a voltage signal applied to the memory cells (e.g., the memory device can apply a voltage offset signal to the memory cells) in performance of the read operation to accurately retrieve the data and therefore improve cross-temperature performance of the memory device. Notably, in some embodiments, application of such a voltage offset signal can occur prior to the data being read by the host and/or prior to, and therefore in the absence of, performance of an error recovery flow (e.g., a deep error recovery flow operation). As used herein, the term "error recovery flow" generally refers to a series of operations to recover read data that includes one or more errors. Generally, each stage of an error recovery flow operation employs increasingly complex techniques to attempt to recover the data that includes the one or more errors. An error recovery flow may be referred to herein in the alternative as a "read recovery operation."

As described in more detail, herein, in some embodiments, temperature information when the write operation is performed can be provided as a bit pattern that is appended to or concatenated on top of the data such that the temperature data is written to a set of memory cells that have been identified for host temperature data input involved in the write and/or read operation.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include a temperature differential-based voltage offset component 113. Although not shown in FIG. 1 so as to not obfuscate the drawings, the temperature differential-based voltage offset component 113 can include various circuitry to facilitate performance of operations to determine a temperature of memory cells of the memory device both at time when a write operation is performed and when a read operation involving the data written to the memory device is performed. The temperature differential-based voltage offset component 113 can perform operations to compare the difference between the temperature when the write operation is performed and when the read operation is performed to a threshold temperature differential to determine if the difference between the temperature when the write operation is performed and when the read operation is performed falls outside the threshold temperature differential. The temperature differential-based voltage offset component 113 may be referred to herein in the alternative as a "controller" or a "processor," given the context of the disclosure.

If the temperature differential-based voltage offset component 113 determines that the difference between the temperature when the write operation is performed and when the read operation is performed falls outside the temperature differential, the temperature differential-based voltage offset component 113 can adjust a voltage signal applied to the memory cells prior to, or during performance of the read operation to accurately retrieve the data and therefore improve cross-temperature performance of the memory device. That is, if it is determined that the difference between the temperature when the write operation is performed and when the read operation is performed falls outside the threshold temperature differential, the temperature differential-based voltage offset component 113 can perform an operation to apply a voltage offset to the memory cells prior to fulfilling a request to perform the read operation. In some embodiments, the temperature differential-based voltage offset component 113 can include special purpose circuitry in the form of an ASIC, FPGA, state machine, and/or other logic circuitry that can allow the temperature differential-based voltage offset component 113 to orchestrate and/or perform operations described herein involving the memory device 130 and/or the memory device 140.

In some embodiments, the memory sub-system controller 115 includes at least a portion of the temperature differential-based voltage offset component 113. For example, the memory sub-system controller 115 can include a processor 117 (processing device) configured to execute instructions stored in local memory 119 for performing the operations described herein. In some embodiments, the temperature differential-based voltage offset component 113 is part of the host system 110, an application, or an operating system.

In some embodiments, the memory sub-system 110, and hence the temperature differential-based voltage offset component 113, can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

In a non-limiting example, an apparatus can include a host computing device (e.g., the host system 120) and a processing unit 121 resident on the host computing device. The processing unit 121 can determine a first temperature of a group of memory cells (e.g., the memory cells 234-1 to 234-N illustrated in FIG. 2, herein) of a memory device 130 couplable to the host computing device. As used herein, the term "resident on" refers to something that is physically located on a particular component. For example, the processing unit 121 being "resident on" the host system 120 refers to a condition in which the hardware circuitry that comprises the processing unit 121 is physically located on the host system 120. The term "resident on" can be used interchangeably with other terms such as "deployed on" or "located on," herein.

Figure 3:
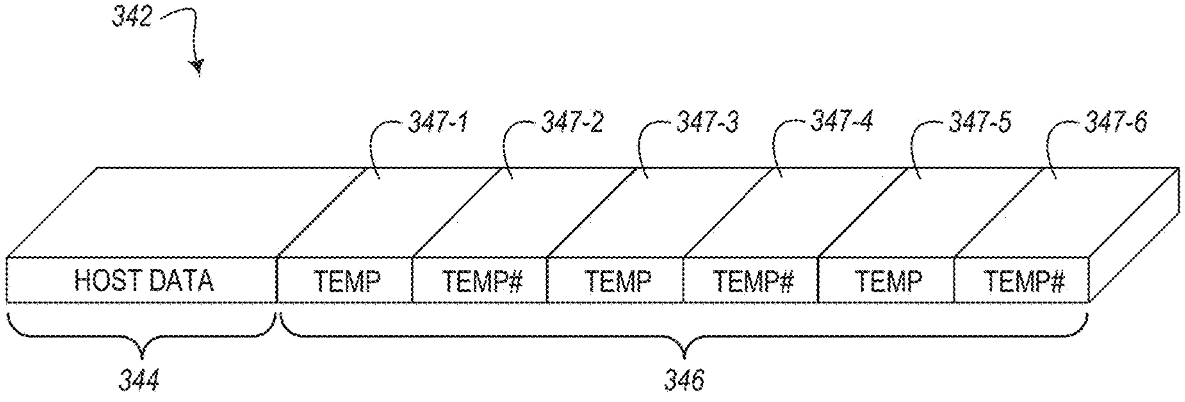
FIG. 3 illustrates an example of data including host data and temperature information of a group of memory cells in accordance with some embodiments of the present disclosure.

The processing unit 121 can append temperature information (e.g., the temperature information 346 illustrated in FIG. 3, herein), which can comprise a bit pattern indicative of the determined first temperature of the group of memory cells to data (e.g., to host data, such as the host data 344 illustrated in FIG. 3, herein) to be written to the group of memory cells. The bit pattern can be referred to herein as a "flag" or "flags" that can be read by the memory device 130 (e.g., read by the temperature differential-based voltage offset component 113) to determine the temperature at the time of performance of the write operation.

Continuing with this example, the processing unit 121 can cause the data to be written to the group of memory cells. At some point after the data has been written to the group of memory cells of the memory device, the processing unit 121 can issue a request to the memory device (e.g., can issue a command to the temperature differential-based voltage offset component 113, the processor 117, and/or the local media controller 135) to read the data from the group of memory cells.

The processing unit 121 (and/or the temperature differential-based voltage offset component 113, the processor 117, and/or the local media controller 135) can determine a second temperature of the group of memory cells. The second temperature of the group of memory cells can be a temperature at which the data is to be read from the group of memory cells. The processing unit 121 (and/or the temperature differential-based voltage offset component 113, the processor 117, and/or the local media controller 135) can compare the first temperature of the group of memory cells to the second temperature of the group of memory cells to determine a difference between the first temperature and the second temperature, and further determine whether a difference between the first temperature and the second temperature is outside a threshold temperature differential.

In some embodiments, the processing unit 121 (and/or the temperature differential-based voltage offset component 113, the processor 117, and/or the local media controller 135) can cause a voltage offset signal to be applied to the group of memory cells responsive to a determination that the difference between the first temperature and the second temperature is outside the threshold temperature differential. In some embodiments, the processing unit 121 (and/or the temperature differential-based voltage offset component 113, the processor 117, and/or the local media controller 135) can refrain from performing an error recovery flow (or "read recovery") operation prior to causing application of the voltage offset signal to the group of memory cells. That is, in contrast to approaches in which an error recovery flow operation is initiated in response to a determination that the data read from the memory cells contains greater than a threshold quantity of errors and/or in response to detection of a cross-temperature event, embodiments herein allow for the voltage offset to be applied to the group of memory cells to correct errors in the data prior to invocation of time-consuming and processing intensive error recovery flow operations, thereby improving the latency, QoS, and cross-temperature performance of the memory device.

In some embodiments, the processing unit 121 (and/or the temperature differential-based voltage offset component 113, the processor 117, and/or the local media controller 135) can determine that the second temperature of the group of memory cells is higher than a highest temperature associated with the threshold temperature differential to determine whether the difference between the first temperature and the second temperature is outside the threshold temperature differential. Embodiments are not so limited, however, and in some embodiments, the processing unit 121 (and/or the temperature differential-based voltage offset component 113, the processor 117, and/or the local media controller 135) can determine that the second temperature of the group of memory cells is lower than a lowest temperature associated with the threshold temperature differential to determine whether the difference between the first temperature and the second temperature is outside the threshold temperature differential.

Continuing with this example, the processing unit 121 (and/or the temperature differential-based voltage offset component 113, the processor 117, and/or the local media controller 135) can determine a temperature of a different group of memory cells of the memory device and append a bit pattern indicative of the determined temperature of the different group of memory cells to subsequent data to be written to the different group of memory cells. In some embodiments, the temperature of the different group of memory cells can refer to a temperature of a group of memory cells at a time when the subsequent data is written to such memory cells. The processing unit 121 (and/or the temperature differential-based voltage offset component 113, the processor 117, and/or the local media controller 135) can cause the subsequent data to be written to the different group of memory cells.

The processing unit 121 (and/or the temperature differential-based voltage offset component 113, the processor 117, and/or the local media controller 135) can determine that the data to be written to the group of memory cells or the subsequent data to be written to the different group of memory cells, or both, comprises sequential data. As used herein, sequential data is generally characterized as being written to sequential physical locations in a group of memory cells and/or a memory array, in contrast to "random data," which is generally characterized as being written to non-sequential physical locations in a group of memory cells and/or a memory array.

The processing unit 121 (and/or the temperature differential-based voltage offset component 113, the processor 117, and/or the local media controller 135) can cause the voltage offset signal to be applied to the group of memory cells to which the subsequent data is written responsive to the determination that the data to be written to the group of memory cells or the subsequent data to be written to the different group of memory cells, or both, comprises sequential data. For example, once a voltage offset to be applied to the group of memory cells is determined, it may be possible for the processing unit 121 (and/or the temperature differential-based voltage offset component 113, the processor 117, and/or the local media controller 135) to set subsequent voltage offsets to be applied to the group of memory cells and/or the different group of memory cells such that the subsequent voltage offsets are equal to the voltage offset applied to the group of memory cells prior to (or during) performance of read operations involving the data and/or the subsequent data if the data and the subsequent data are determined to comprise sequential data. In some embodiments, the processing unit 121 (and/or the temperature differential-based voltage offset component 113, the processor 117, and/or the local media controller 135) can set a bit pattern or "flag" that is appended to, or concatenated on, subsequent data written to the memory device (e.g., to the group of memory cells and/or the different group of memory cells) to indicate that a same voltage offset applied to the group of memory cells prior to (or during) performance of read operations involving the data is to be applied to the group of memory cells and/or the different group of memory cells prior to (or during) performance of read operations involving the subsequent data that is written to the memory device.

Figure 2:
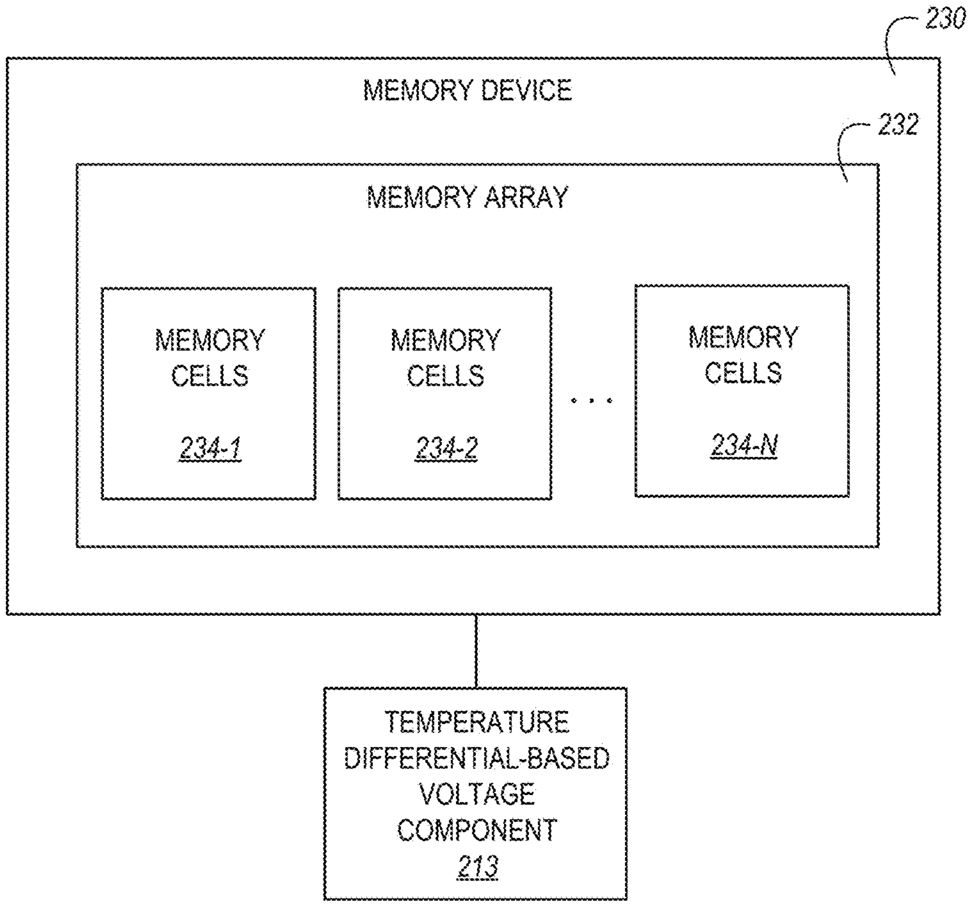
FIG. 2 illustrates an example memory device in accordance with some embodiments of the present disclosure.

FIG. 2 illustrates an example memory device 230 in accordance with some embodiments of the present disclosure. The memory device 230 can be analogous to the memory device 130 illustrated in FIG. 1, herein. As shown in FIG. 2, the memory device 230 includes a memory array 232, which includes various groups or "sets" of memory cells 234-1 to 234-N. The memory cells 234-1 to 234-N can be NAND memory cells and can include combinations of SLCs, MLCs, TLCs, QLCs, and beyond. However, in at least one embodiment, one or more of the groups of memory cells 234-1 to 234-N includes TLCs and/or QLCs. In some embodiments, the groups of memory cells 234-2 to 234-N can be blocks of memory cells, pages of memory cells, word line groups comprising memory cells, blocks of memory cells associate with a memory die, superblocks of memory cells, etc.

As illustrated in FIG. 2, the memory device 230 is coupled to a temperature differential-based voltage component 213, which can be analogous to the temperature differential-based voltage component 113 illustrated in FIG. 1. As described above, the temperature differential-based voltage component 213 can include special purpose circuitry in the form of an ASIC, FPGA, state machine, and/or other logic circuitry that can allow the temperature differential-based voltage offset component 213 to orchestrate and/or perform operations described herein involving the memory device 230. The temperature differential-based voltage offset component 213 can be referred to for brevity as a "controller" or a "processor" in the context of the disclosure.

In a non-limiting example, an apparatus, (e.g., the memory device 230, and/or the temperature differential-based voltage offset component 213) can include a memory array 232 and a controller (e.g., the temperature differential-based voltage offset component 213). The controller can control performance of an operation to write data to at least one group of memory cells 234-1 to 234-N of the memory array 232. The data can include information indicative of a temperature of the group of memory cells 234-1 to 234-N. The information indicative of the temperature of the group of memory cells 234-1 to 234-N can be a temperature of the group of the memory cells 234-1 to 234-N during the operation to write the data to the memory array 232 or a temperature of the group of memory cells 234-1 to 234-N preceding the operation to write the data to the memory array 232. The information indicative of the temperature of the group of memory cells can be determined by the controller (e.g., within the memory device 230 and/or circuitry associated therewith) and/or by a host system (e.g., the host system 120 illustrated in FIG. 1, herein). In such embodiments, the controller and/or the host can append or concatenate the information indicative of the temperature of the group of memory cells to the data prior to performance of the operation to write data to the group of memory cells.

In some embodiments, a request to control performance of the operation to write data to a group of memory cells 234-1 to 234-N of the memory array 232 can be received by the controller from a host system, such as the host system 120 illustrated in FIG. 1, herein, and the data can include host data generated by the host system. The host data can be analogous to the host data 344 illustrated in FIG. 3, herein.

Continuing with this example, the controller can receive a command to access (e.g., read) the data written to the group of memory cells 234-1 to 234-N. The controller can determine whether a current temperature of the group of memory cells 234-1 to 234-N is outside a threshold temperature differential that is based, at least in part, on the information indicative of the temperature of the group of memory cells 234-1 to 234-N. The current temperature can refer to a temperature of the group of memory cells 234-1 to 234-N that is determined at the time of accessing the data from the group of memory cells 234-1 to 234-N, or a temperature of the group of memory cells 234-1 to 234-N that is determined immediately prior (e.g., within tens of seconds) prior to accessing the data. The current temperature can be determined by circuitry associated with the memory device 230 and/or the current temperature can be determined by the host system.

The threshold temperature differential can refer to temperatures that fall outside of a predetermined range of temperatures that correspond to a difference between a lower temperature value and an upper temperature value that can be indicative of accurate retrieval of the data under cross-temperature conditions. For example, a "temperature differential" can generally refer to a range of temperatures associated with writing and reading data in a cross-temperature setting in which the validity of the read data can generally be accurate (e.g., in which the data does not have greater than a particular quantity of uncorrectable errors, etc.). The temperature differential can be represented as a difference (e.g., a "delta") between an upper temperature limit and a lower temperature limit associated with writing and reading data in a cross-temperature setting in which the validity of the read data can generally be accurate.

As an illustrative example, the threshold temperature differential can be determined to be a difference of 25° C. between the temperature at which the data was written and the temperature at which the data is to be read. If the data was written at a temperature of 20° C. and is to be read at a temperature of 50° C., it may be determined that the threshold temperature differential is met or exceeded, because the difference between the temperature at which the data was written and the temperature at which the data is, in this example, to be read is 30° C. Based on the determination that the threshold temperature differential is met or exceeded, a voltage offset signal can be applied to the group of memory cells 234-1 to 234-N prior to fulfilling a read request involving the data, as described herein.

As a further illustrative example, the threshold temperature differential can be determined to be a difference of 31° C. between the temperature at which the data was written and the temperature at which the data is to be read. If the data was written at a temperature of 20° C. and is to be read at a temperature of 50° C., it may be determined that the temperature at which the data is written and the temperature at which the data is to be read falls below the threshold temperature differential, because the difference between the temperature at which the data was written and the temperature at which the data is, in this example, to be read is 30° C. and the threshold temperature differential is 31° C. Based on the determination that the threshold temperature differential is not met or exceeded, a voltage offset signal may not be applied to the group of memory cells 234-1 to 234-N prior to fulfilling a read request involving the data, as described herein.

Accordingly, in some embodiments, the controller can determine that the current temperature of the group of memory cells 234-1 to 234-N is higher than a highest temperature associated with the threshold temperature differential to determine that the current temperature of the group of memory cells 234-1 to 234-N is outside the threshold temperature differential. Similarly, in some embodiments, the controller can determine that the current temperature of the group of memory cells 234-1 to 234-N is lower than a lowest temperature associated with the threshold temperature differential to determine that the current temperature of the group of memory cells 234-1 to 234-N is outside the threshold temperature differential.

Embodiments are not so limited, however, and in some embodiments, the controller can determine that a difference between the current temperature of the group of memory cells 234-1 to 234-N and the temperature of the group of the memory cells 234-1 to 234-N prior to or during the operation to write the data to the memory array 232 is higher than a highest temperature associated with the threshold temperature differential to determine that the current temperature of the group of memory cells 234-1 to 234-N is outside the threshold temperature differential. Similarly, in some embodiments, the controller can determine that a difference between the current temperature of the group of memory cells 234-1 to 234-N and the temperature of the group of the memory cells 234-1 to 234-N prior to or during the operation to write the data to the memory array 232 is lower than a lowest temperature associated with the threshold temperature differential to determine that the current temperature of the group of memory cells 234-1 to 234-N is outside the threshold temperature differential.

In addition to, or in the alternative, in some embodiments, the controller can determine the threshold temperature differential by determining a difference between a temperature indicated by the information indicative of the temperature of the group of memory cells 234-1 to 234-N and a target temperature (e.g., an expected temperature of the group of memory cells) of the group of memory cells 234-1 to 234-N and determining a difference between the current temperature of the group of memory cells 234-1 to 234-N and the target temperature of the group of memory cells 234-1 to 234-N.

In some embodiments, the controller can apply a voltage offset signal to the group of memory cells 234-1 to 234-N responsive to a determination that the current temperature of the group of memory cells 234-1 to 234-N is outside the threshold temperature differential. In some embodiments, the controller and/or the host can refrain from initiating performance of an error recovery flow operation prior to applying the voltage offset signal to the group of memory cells 234-1 to 234-N.

Continuing with this example, in some embodiments, the controller can determine that the data comprises sequential write data based, at least in part, on a bit pattern included in the data. The bit pattern can include information, such as a "flag" that indicates that the write data is sequential, as described in more detail, herein. The controller can then determine that subsequent data to be written to the group of memory cells 234-1 to 234-N comprises sequential write data based, at least in part, on a bit pattern included in the subsequent data to be written to the group of memory cells 234-1 to 234-N and apply the voltage offset signal (e.g., the same voltage offset signal applied during the read operation involving preceding data) to the group of memory cells 234-1 to 234-N prior to performance of an operation to read the subsequent data from the group of memory cells 234-1 to 234-N responsive to the determination that the data or the subsequent data comprises sequential write data.

FIG. 3 illustrates an example of data 342 including host data 344 and temperature information 346 of a group of memory cells in accordance with some embodiments of the present disclosure. The data 342 can represent data written to a memory device, such as the memory device 130 illustrated in FIG. 1 and/or the memory device 230 illustrated in FIG. 2. In the example illustrated in FIG. 3, the data 342 includes host data 344, which can include around 16,000 Kilobytes (KB) of host data and six bytes of temperature data 347-1, 347-2, 347-3, 347-4, 347-5, and 347-6. It will be appreciated that greater than or fewer than six bytes temperature data 347-1 to 347-6 may be included in the data 342. Further, it is contemplated that the host data 344 may include fewer than around 16,000 KB. That is, in some embodiments, the host data 344 may include non-sequential data as opposed to the sequential host data 344 illustrated in FIG. 3.

As shown in FIG. 3, the temperature information 346 is written in an alternating pattern between temperature information (TEMP 347-1, 347-3, 347-5) and the complement of the temperature information (TEMP #347-2, 347-4, 347-6). This can allow for the temperature information 346 to be written without error correction information (e.g., error correction code (ECC) information), while still allowing for the memory device to correct and/or recover errors that may become present in the temperature information 346. For example, when the temperature information is captured and programmed (e.g., by the host or by the memory device), the temperature information 346 may not include ECC coverage that the memory device could use to correct bit errors that may occur in the bytes of temperature data 347-1 to 347-6. To account for this possibility, in some embodiments, the temperature information 346 is stored in multiple copies that each include respective complement temperature information, such as TEMP 347-1 TEMP #and 347-2. In embodiments in which multiple such temperature data and the respective complement temperature data are stored, the memory device can read those multiple temperature/temperature #combinations and, if needed, apply majority rules voting to determine the temperature at the time of programming without ECC to correct bit errors in the data that may occur.

In some embodiments, the host data 344 can be written to a page of memory cells of the memory device. In such embodiments, the group of memory cells can correspond to a page of NAND memory cells. In contrast, the temperature information 346 can be inputted to a set of memory cells that have been identified for host temperature data input in the NAND page.

Figure 4:
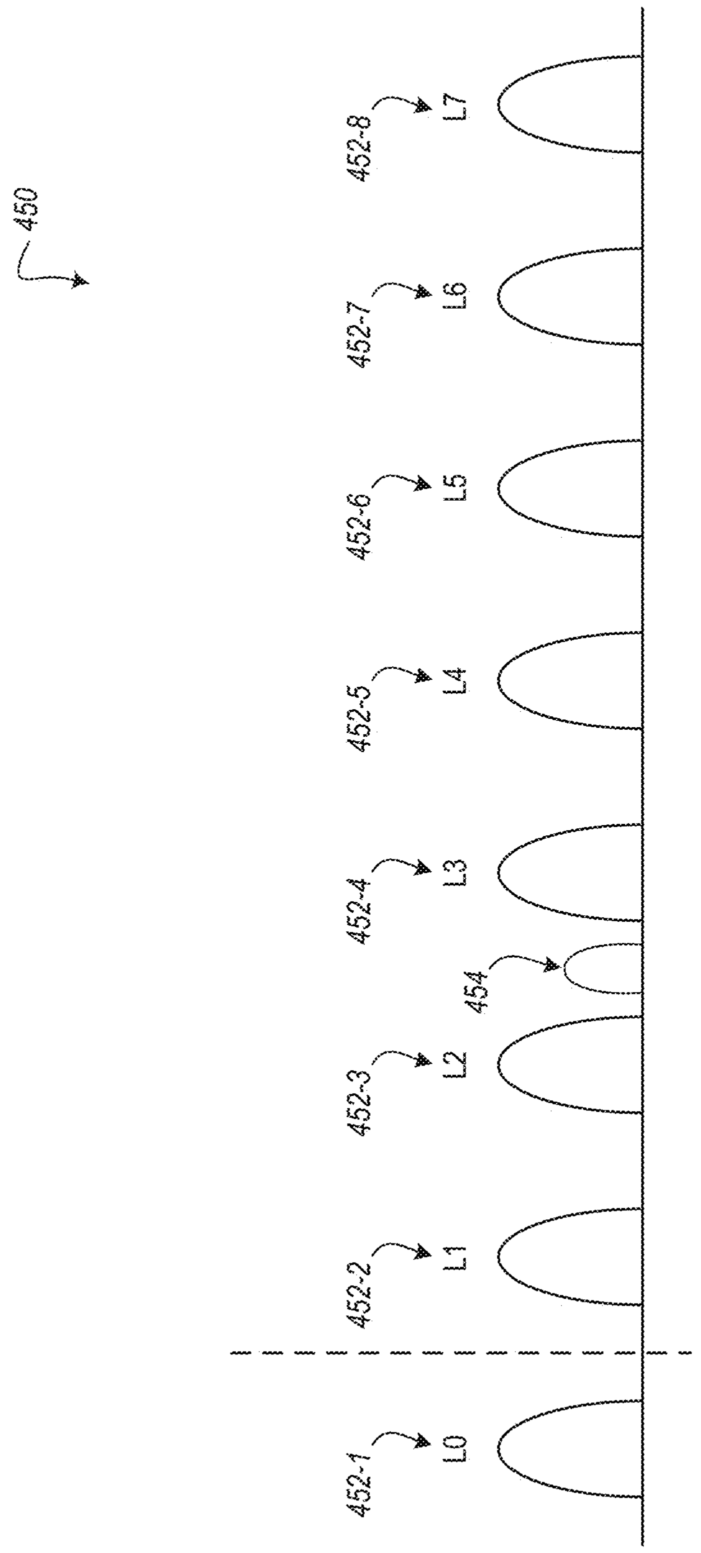
FIG. 4 illustrates an example of a voltage distribution associated with a triple level memory cell in accordance with some embodiments of the present disclosure.

FIG. 4 illustrates an example of a voltage distribution 450 associated with a triple level memory cell in accordance with some embodiments of the present disclosure. As will be appreciated, the x-axis represents $V_T$, while the y-axis represents the distribution of the respective logic levels. As shown in FIG. 4, there are eight (corresponding to a TLC) programmed states 452-1, 452-2, 452-3, 452-4, 452-5, 452-6, 452-7, and 452-8, each of which has a corresponding logic level L0, L1, L2, L3, L4, L5, L6, and L7 associated therewith. Although not shown so as to not obfuscate the drawings, it will be appreciated that for a TLC, each of the programmed states (e.g., logic states) 452-1, 452-2, 452-3, 452-4, 452-5, 452-6, 452-7, and 452-8 can represent three bits of data, for example, one bit corresponding to an upper page, one bit corresponding to a lower page, and one bit corresponding to an extra page. Further, although illustrated for clarity in FIG. 4 as a TLC, embodiments are not so limited and SLC, MLC, QLC, and beyond are contemplated within the scope of the disclosure.

In some embodiments, the temperature data described herein (e.g., the temperature information 346 illustrated in FIG. 3) can be programmed within the TLC distribution 450 as shown by the temperature program state 454. Although shown as lying between the programmed states 452-3 and 452-4 (e.g., between the logic levels L2 and L3), embodiments are not so limited, and the temperature program state 454 can be programmed anywhere along the voltage distribution 450, provided that it resides between two contiguous programmed states 452 and, accordingly, between two contiguous logic levels L0, L1, L2, L3, L4, L5, L6, and L7 corresponding to the TLC programmed states 452.

As described herein, the temperature program state 454 can correspond to the information indicative of a temperature of a group of memory cells (e.g., one or more of the memory cells 234-1 to 234-N illustrated in FIG. 2), a first temperature of the group of memory cells, and/or a second temperature of the group of memory cells. In some embodiments, the temperature program state 454 can be programmed by a host (e.g., by the processing unit 121 of the host system 120 illustrated in FIG. 1) and/or by a controller (e.g., the temperature differential-based voltage offset component 113, the processor 117, and/or the local media controller 135 illustrated in FIG. 1). That is, in some embodiments, the first and/or second temperature of the group of memory cells can be determined by the host or by the memory device itself.

Figure 5:
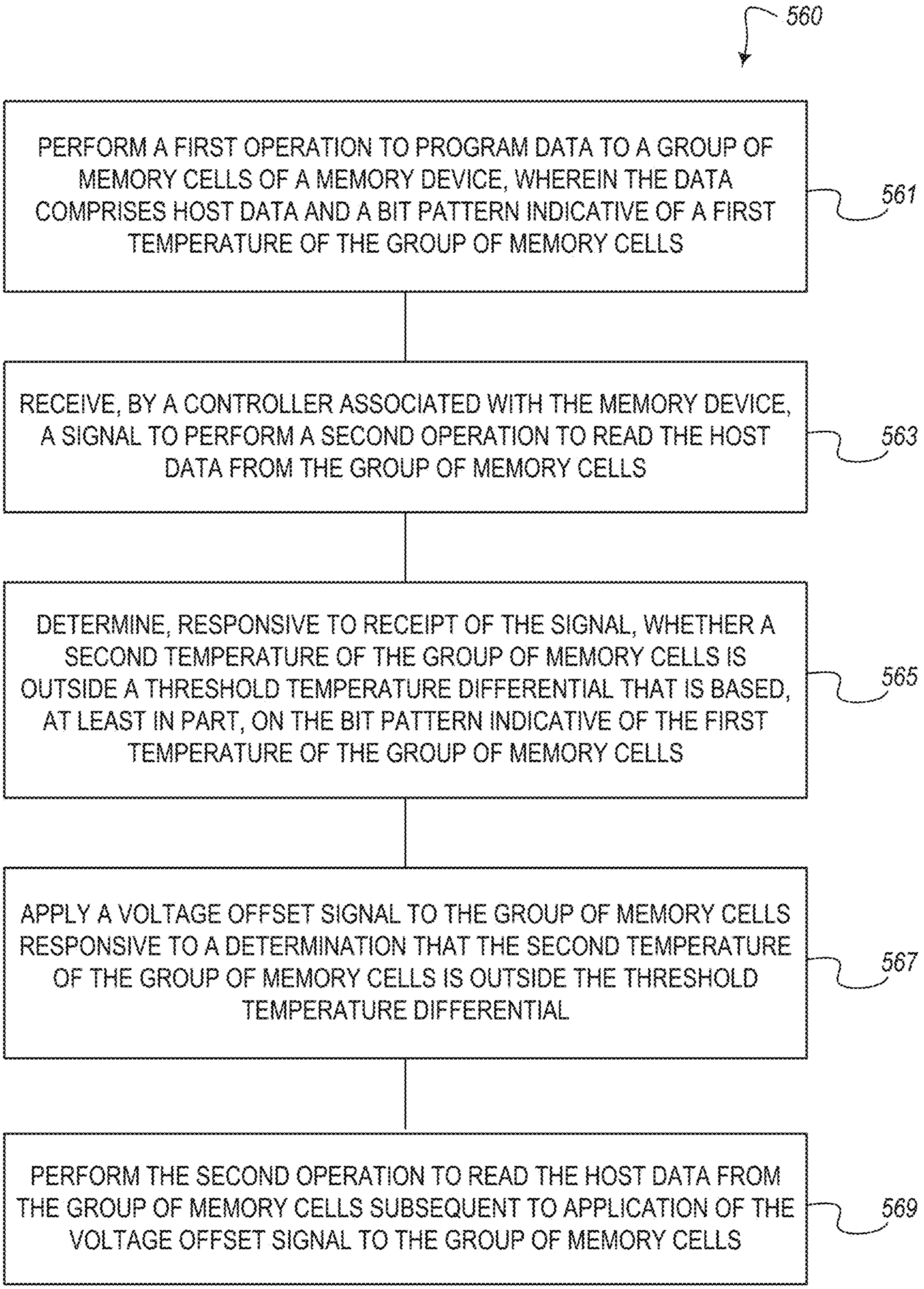
FIG. 5 is a flow diagram corresponding to a method for temperature differential-based voltage offset control in accordance with some embodiments of the present disclosure.

FIG. 5 is a flow diagram corresponding to a method 560 for temperature differential-based voltage offset control in accordance with some embodiments of the present disclosure. The method 560 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 560 is performed by the temperature differential-based voltage offset component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 561, a first operation to program data to a group of memory cells (e.g., the memory cells 234-1 to 234-N illustrated in FIG. 2, herein) of a memory device (e.g., the memory device 230 illustrated in FIG. 2, herein) can be performed. The data can include host data (e.g., the host data 344 illustrated in FIG. 3, herein) and a bit pattern indicative of a first temperature of the group of memory cells (e.g., the temperature information 346 illustrated in FIG. 3, herein).

At operation 563, a controller associated with the memory device can receive a signal to perform a second operation to read the host data from the group of memory cells. The controller can be analogous to the temperature differential-based voltage offset component 113, the processor 117, and/or the local media controller 135 illustrated in FIG. 1.

At operation 565, responsive to receipt of the signal, a determination can be made as to whether a second temperature of the group of memory cells is outside a threshold temperature differential that is based, at least in part, on the bit pattern indicative of the first temperature of the group of memory cells. As described above, in some embodiments, the first temperature corresponds to a temperature at a time when the first operation is performed, and the second temperature corresponds to a temperature at a time when the second operation is performed. In some embodiments, the threshold temperature differential can correspond to a difference between the first temperature and the second temperature. However, embodiments are not so limited, and in some embodiments, the threshold temperature differential corresponds to a predetermined difference between program and read temperatures corresponding to adequate cross-temperature performance.

In some embodiments, the second temperature being outside the threshold temperature differential corresponds to the second temperature being higher than the threshold temperature differential. Embodiments are not so limited, however, and as described above, in some embodiments, the difference between the first temperature and the second temperature can be compared to the threshold temperature differential to determine if the difference between the first temperature and the second temperature is higher than the threshold temperature differential.

Similarly, in some embodiments, the second temperature being outside the threshold temperature differential corresponds to the second temperature being lower than the threshold temperature differential. Embodiments are not so limited, however, and as described above, in some embodiments, the difference between the first temperature and the second temperature can be compared to the threshold temperature differential to determine if the difference between the first temperature and the second temperature is lower than the threshold temperature differential.

At operation 567, a voltage offset signal can be applied to the group of memory cells responsive to a determination that the second temperature of the group of memory cells is outside the threshold temperature differential. In some embodiments, the method 560 includes refraining from performing a read recovery operation prior to applying the voltage offset signal to the group of memory cells. At operation 569, the second operation to read the host data from the group of memory cells can be performed subsequent to application of the voltage offset signal to the group of memory cells.

As described above, an operation to determine the first temperature can be performed by a host (e.g., the host system 120 and/or the processing unit 121 illustrated in FIG. 1, herein). In such embodiments, the host can append the bit pattern indicative of the first temperature of the group of memory cells to the data. Embodiments are not so limited, however, and in some embodiments, an operation to determine the first temperature can be performed by a controller (e.g., the temperature differential-based voltage offset component 113, the processor 117, and/or the local media controller 135 illustrated in FIG. 1, herein) associated with a memory device (e.g., the memory device 130 illustrated in FIG. 1, herein). In such embodiments, the controller can append (or concatenate) the bit pattern indicative of the first temperature of the group of memory cells to the data.

Figure 6:
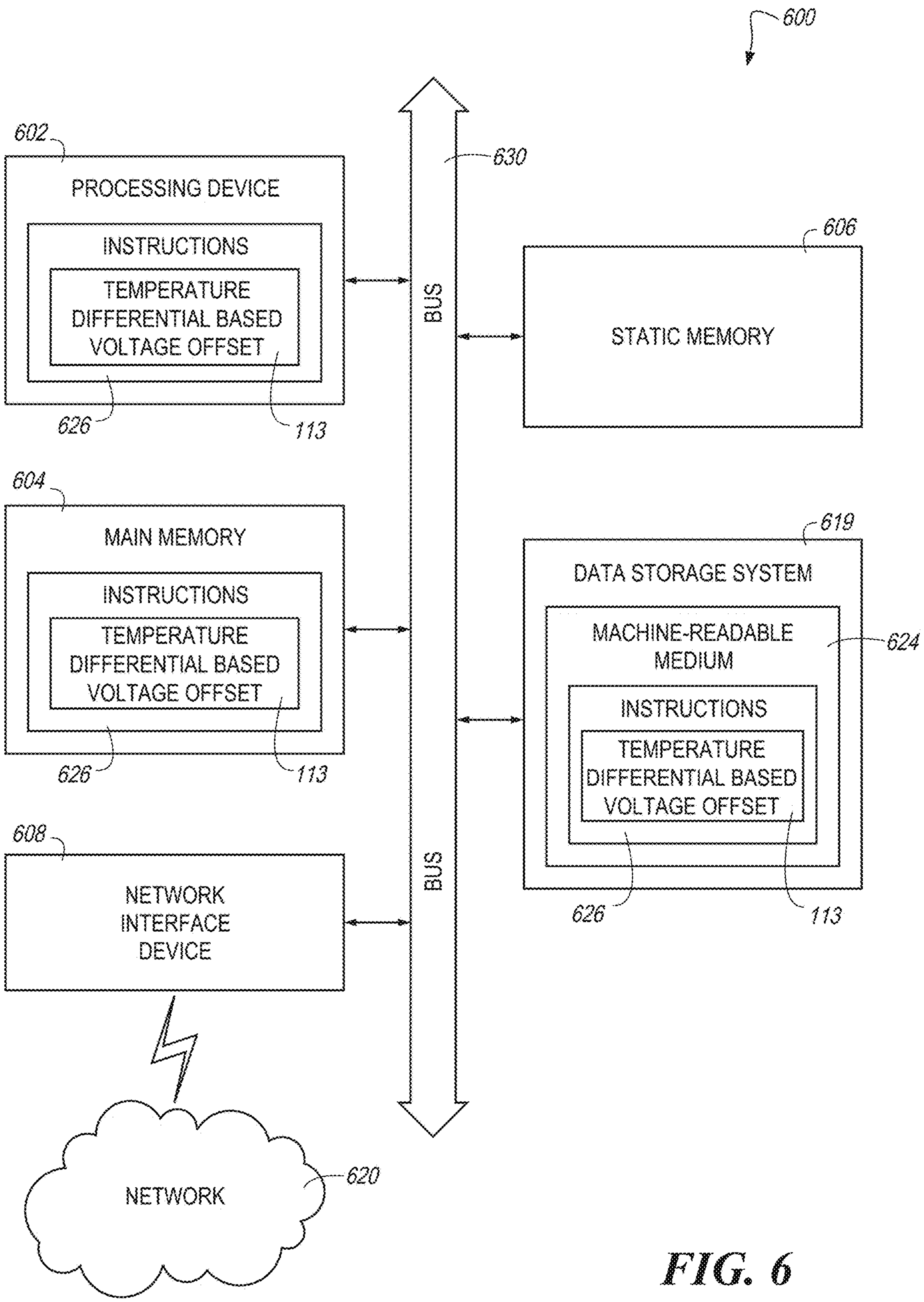
FIG. 6 is a block diagram of an example computer system in which embodiments of the present disclosure may operate.

FIG. 6 is a block diagram of an example computer system 600 in which embodiments of the present disclosure may operate. For example, FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the temperature differential-based voltage offset component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

The processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a memory access mode selection component (e.g., the temperature differential-based voltage offset component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method, comprising:

performing a first operation to program data to a group of memory cells of a memory device, wherein the data comprises host data and a bit pattern indicative of a first temperature of the group of memory cells when the data is programmed;

receiving, by a controller, a request to perform a second operation to read the host data from the group of memory cells;

in response to receiving the request, and prior to reading the host data from the group of memory cells, determining the first temperature by reading the bit pattern from the group of memory cells;

in association with performing the second operation, determining a second temperature associated with the group of memory cells;

responsive to a determined difference between the first temperature and the second temperature being outside a threshold temperature differential, applying a voltage offset to the group of memory cells in association with reading the host data from the group of memory cells, wherein the voltage offset is applied to the group of memory cells during, or prior to, reading the host data from the group of memory cells; and responsive to the determined difference between the first temperature and the second temperature being within the threshold temperature differential, refraining from applying the voltage offset to the group of memory cells in association with reading the host data from the group of memory cells.

2. The method of claim 1, wherein the second temperature corresponds to a temperature at a time when the second operation is performed.

3. The method of claim 1, wherein the difference between the first temperature and the second temperature being outside the threshold temperature differential corresponds to the second temperature being higher than the threshold temperature differential.

4. The method of claim 1, wherein the difference between the first temperature and the second temperature being outside the threshold temperature differential corresponds to the second temperature being lower than the threshold temperature differential.

5. The method of claim 1, further comprising applying the voltage offset to the group of memory cells in an absence of performance of an error recovery flow operation.

6. The method of claim 1, further comprising:

performing, by a host couplable to or by the controller associated with the memory device, an operation to determine the first temperature; and appending, by the host, the bit pattern indicative of the first temperature of the group of memory cells to the data.

7. The method of claim 1, wherein the voltage offset is applied to the group of memory cells prior to or during the performance of reading the data from the group of memory cells.

8. An apparatus, comprising:

a memory array; and a controller coupled to the memory array, wherein the controller is configured to:

control performance of an operation to write host data along with temperature data to a group of memory cells of the memory array, wherein the temperature data includes information indicative of a first temperature of the group of memory cells when the host data is written;

receive a command to read the host data written to the group of memory cells;

in response to receiving the command, and prior to reading the host data, determine the first temperature by reading the temperature data from the group of memory cells;

in association with reading the host data written to the group of memory cells, determine a current temperature of the group of memory cells;

determine that the current temperature of the group of memory cells is higher than a highest temperature associated with a threshold temperature differential to determine that the current temperature of the group of memory cells is outside the threshold temperature differential;

determine that the current temperature of the group of memory cells is lower than a lowest temperature associated with the threshold temperature differential to determine that the current temperature of the group of memory cells is outside the threshold temperature differential;

responsive to a determined difference between the first temperature and the current temperature being outside the threshold temperature differential, apply a voltage offset to the group of memory cells in association with reading the host data from the group of memory cells; and responsive to the determined difference between the first temperature and the current temperature being within the threshold temperature differential, refrain from applying the voltage offset to the group of memory cells in association with reading the host data from the group of memory cells.

9. The apparatus of claim 8, wherein the controller is further configured to store the first temperature of the group of memory cells, including respective complement temperature information of the group of memory cells, in multiple copies, wherein a majority rules voting is applied to the multiple copies when the first temperature is read from the multiple copies.

10. The apparatus of claim 8, wherein the threshold temperature differential is a range of temperatures between an upper temperature limit and a lower temperature limit associated with the first temperature and the current temperature.

11. The apparatus of claim 8, wherein the controller is further configured to refrain from initiating performance of an error recovery flow prior to applying the voltage offset to the group of memory cells.

12. The apparatus of claim 8, wherein:

the temperature data of the group of memory cells is determined by the controller, and the controller is further configured to concatenate the temperature data to the host data prior to performance of the operation to write the host data to the group of memory cells.

13. The apparatus of claim 8, wherein the controller is further configured to determine the threshold temperature differential by:

determining a difference between the first temperature of the group of memory cells and a target temperature of the group of memory cells; and determining a difference between the current temperature of the group of memory cells and the target temperature of the group of memory cells.

14. An apparatus, comprising:

a host computing device; and a processing unit resident on the host computing device, wherein the processing unit is configured to:

determine a first temperature of a group of memory cells of a memory device couplable to the host computing device;

append a bit pattern indicative of the determined first temperature of the group of memory cells to data to be written to the group of memory cells;

cause the bit pattern and the data to be written to the group of memory cells;

issue a request to the memory device to read the data from the group of memory cells;

determine a second temperature of the group of memory cells;

compare the first temperature of the group of memory cells to the second temperature of the group of memory cells;

responsive to a determined difference between the first temperature and the second temperature being outside a threshold temperature differential, cause a voltage offset to be applied to the group of memory cells in association with reading the data from the group of memory cells;

responsive to the determined difference between the first temperature and the second temperature being within the threshold temperature differential, refrain from causing application of the voltage offset to the group of memory cells in association with reading the data from the group of memory cells; and set a flag that is appended to or concatenated on subsequent data written to the memory device to indicate that a same voltage offset applied to the group of memory cells is to be applied to a different group of memory cells involving the subsequent data.

15. The apparatus of claim 14, wherein the processing unit is further configured to:

determine that the second temperature of the group of memory cells is higher than a highest temperature associated with the threshold temperature differential to determine whether the difference between the first temperature and the second temperature is outside the threshold temperature differential, or determine that the second temperature of the group of memory cells is lower than a lowest temperature associated with the threshold temperature differential to determine whether the difference between the first temperature and the second temperature is outside the threshold temperature differential.

16. The apparatus of claim 14, wherein the voltage offset is applied to the group of memory cells to correct errors within the data.

* * * * *